United States Patent
Ishizuka et al.

(10) Patent No.: US 6,465,347 B2
(45) Date of Patent: *Oct. 15, 2002

(54) TUNGSTEN FILM FORMING METHOD

(75) Inventors: Hotaka Ishizuka, Kofu; Mitsuhiro Tachibana, Yamanashi-Ken, both of (JP)

(73) Assignee: Tokyo Electron Limited, Tokyo-to (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/988,327

(22) Filed: Nov. 19, 2001

(65) Prior Publication Data

US 2002/0048938 A1 Apr. 25, 2002

Related U.S. Application Data

(63) Continuation of application No. 09/459,974, filed on Dec. 14, 1999, now Pat. No. 6,331,483.

(30) Foreign Application Priority Data

Dec. 18, 1998 (JP) .......................... 10-375980
Dec. 18, 1998 (JP) .......................... 10-375981

(51) Int. Cl.[7] ........................ H01L 21/4763
(52) U.S. Cl. ............... 438/648; 438/656; 438/685; 438/761; 438/763; 427/250; 427/123; 427/124
(58) Field of Search ............... 438/648, 656, 438/685, 761, 763; 427/250, 123, 124

(56) References Cited

U.S. PATENT DOCUMENTS

| 5,306,666 A | 4/1994 | Izumi ..................... 437/192 |
| 6,099,904 A | 8/2000 | Mak et al. ............... 427/253 |
| 6,107,200 A | 8/2000 | Takagi et al. ........... 438/685 |
| 6,162,715 A | 12/2000 | Mak et al. ............... 438/592 |
| 6,331,483 B1 * | 12/2001 | Ishizuka et al. ......... 438/648 |

* cited by examiner

Primary Examiner—Kamand Cuneo
Assistant Examiner—David A. Zarneke
(74) Attorney, Agent, or Firm—Smith, Gambrell & Russell, LLP

(57) ABSTRACT

A method of forming a tungsten film is capable of forming a tungsten film having a low resistivity. The method of forming a tungsten film (50) on a surface of a workpiece by a vacuum processing system (2) comprises, in sequential steps: a seed crystal growing process for growing tungsten seed crystal grains (48) on the surface of the workpiece in an atmosphere of a film forming gas containing tungsten atoms; a boron-exposure process for exposing the workpiece to an atmosphere of a boron-containing gas for a short time; and a tungsten film forming process for forming a tungsten film by making the tungsten seed crystal grains grow in an atmosphere of a gas containing a film forming gas containing tungsten atoms, and a hydrogen-diluted boron-containing gas. The tungsten film has a low resistivity.

22 Claims, 11 Drawing Sheets

SEED CRYSTAL GRAIN GROWING PROCESS

BORON-EXPOSURE PROCESS
5% B$_2$H$_6$ GAS

TUNGSTEN FILM FORMING PROCESS
H$_2$ GAS + 5% B$_2$H$_6$ GAS

SEED CRYSTAL GRAIN GROWING PROCESS

BORON-EXPOSURE PROCESS
5% $B_2H_6$ GAS

TUNGSTEN FILM FORMING PROCESS
$H_2$ GAS + 5% $B_2H_6$ GAS

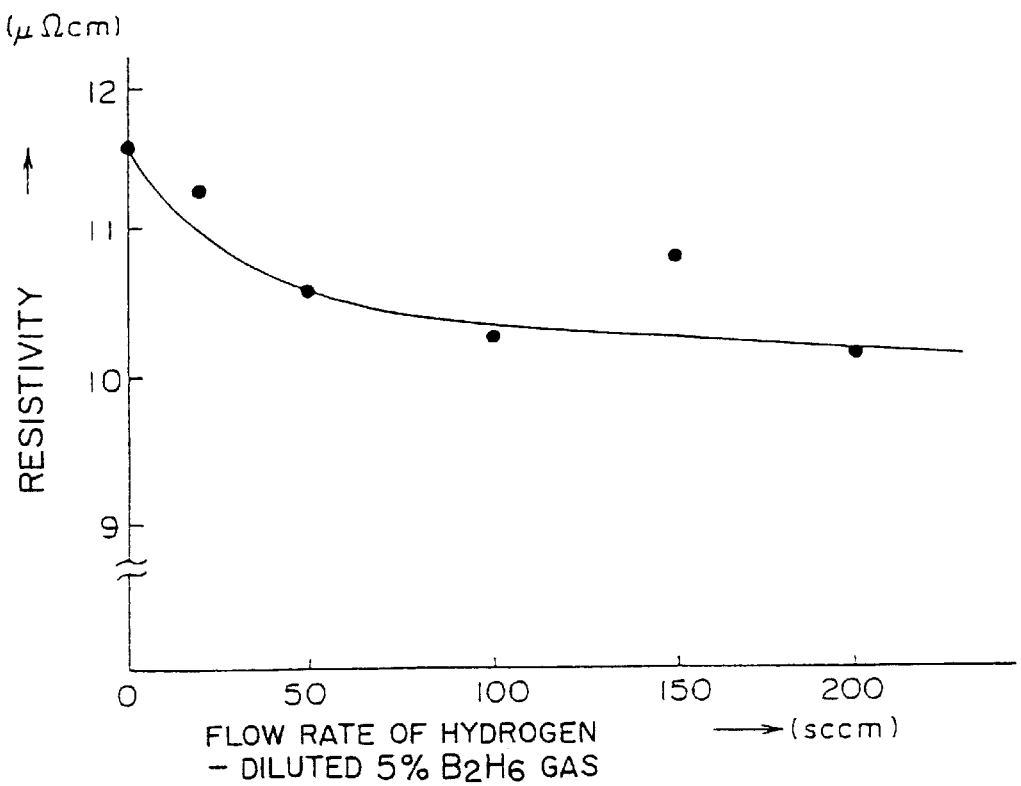
F I G. 4
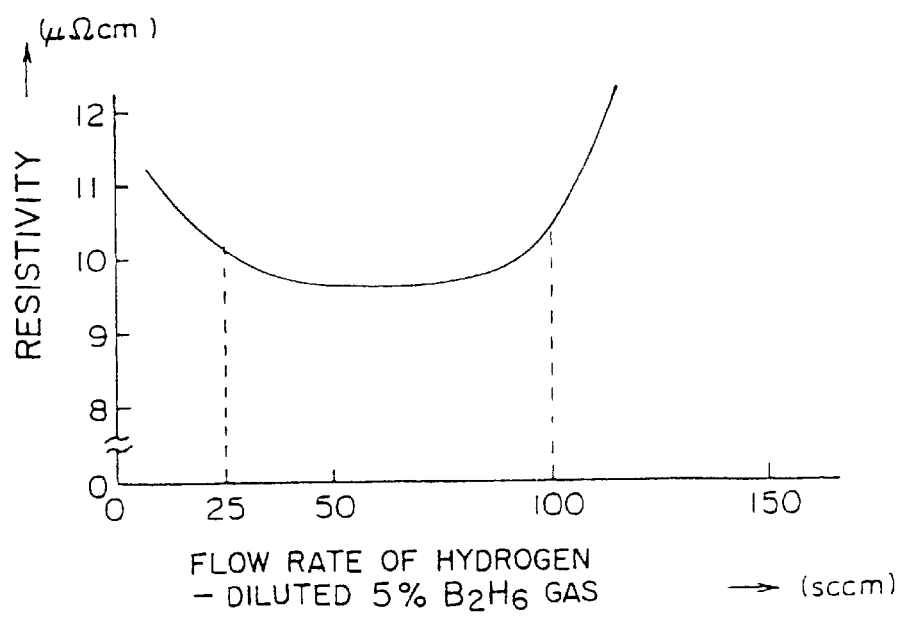
F I G. 5

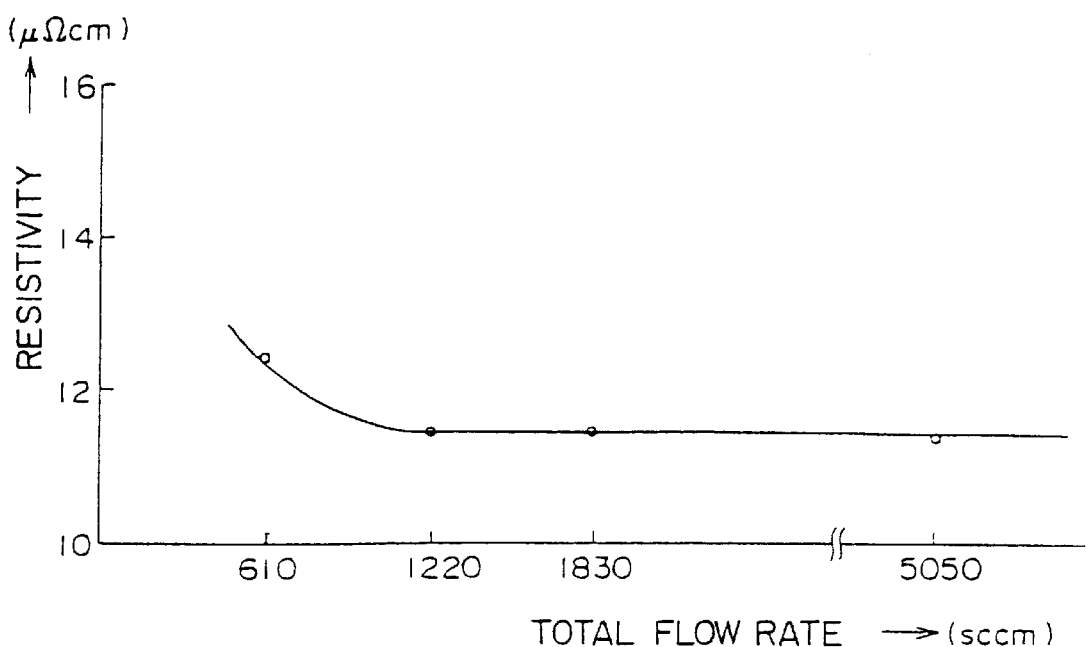
F I G. 6
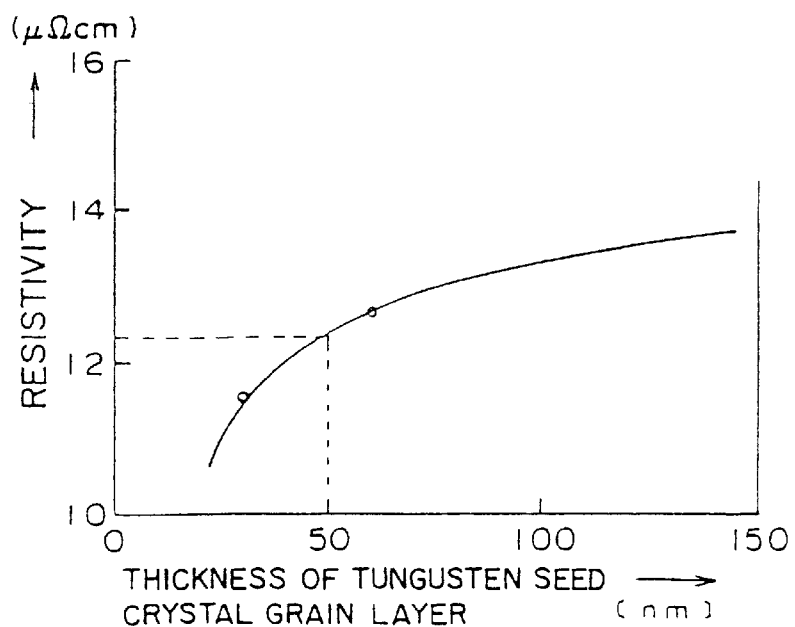
F I G. 7

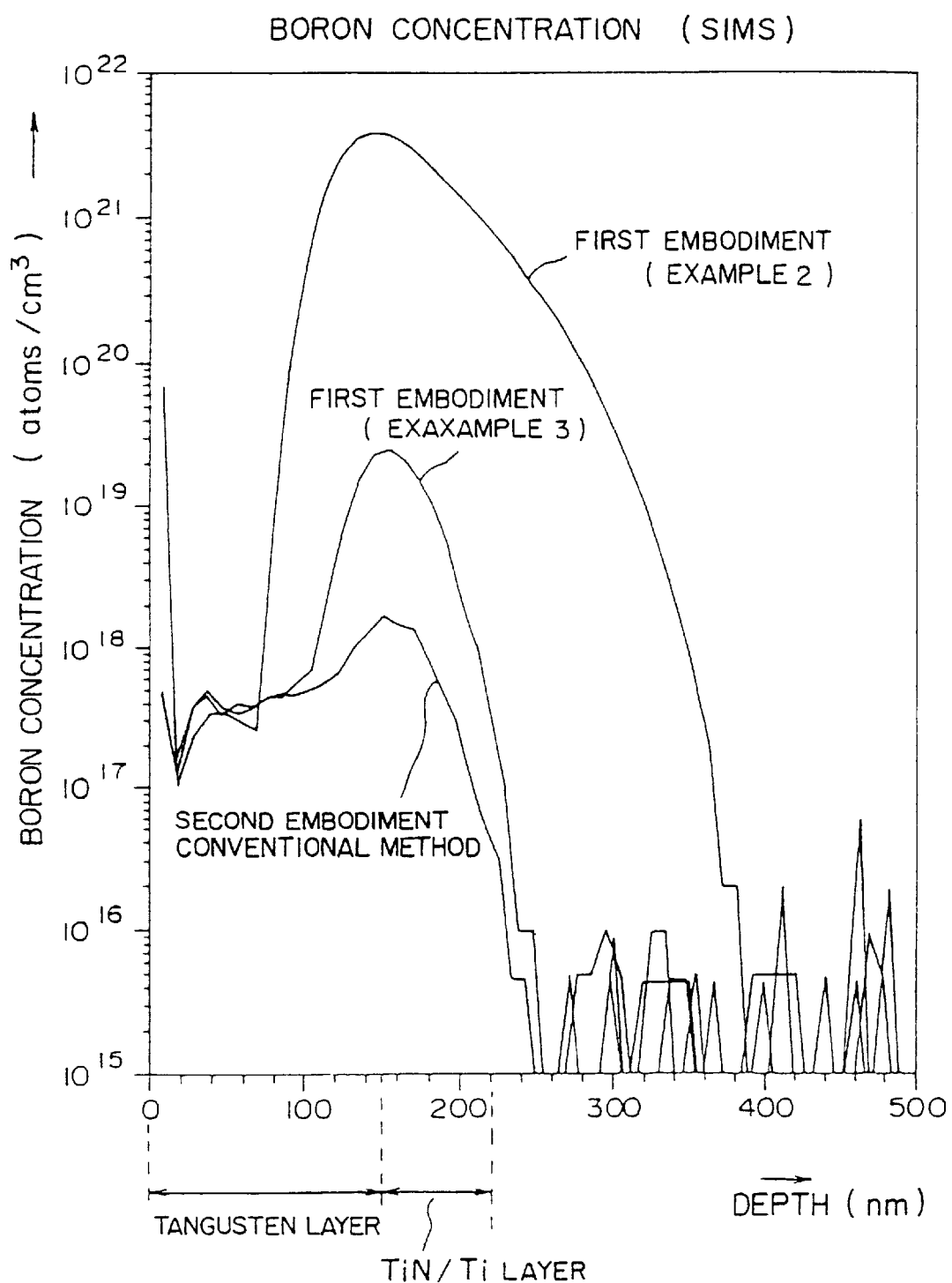
F I G. 10

TUNGSTEN FILM FORMING METHOD

The present application is a continuation of Ser. No. 09/459,974, filed Dec. 14, 1999, now U.S. Pat. No. 6,331,483 which prior application is incorporated herein by reference.

TECHNICAL FIELD

The present invention relates to a method of forming a tungsten film having an improved resistivity.

BACKGROUND ART

Generally, a film of a metal or a metal compound, such as W (tungsten), WSi (tungsten silicide), Ti (titanium), TiN (titanium nitride)or TiSi (titanium silicide), is deposited to form a wiring pattern on a semiconductor wafer, to fill up holes between wiring lines or to form wiring patterns and fill up holes between wiring lines in a semiconductor integrated circuit fabricating process.

Methods of forming such metal thin films are classified into those of $H_2$ reduction system (hydrogen reduction system), those of $SiH_4$ reduction system (Silane reduction system) and those of $SiH_2Cl_2$ reduction system (dichlorosilane reduction system). When forming a wiring pattern by the method of $SiH_2Cl_2$ reduction system, dichlorosilane gas is used as a reducing gas and a W or a WSi film (tungsten silicide film) is formed at a high temperature on the order of 600° C. When forming a wiring pattern by the method of $SiH_4$ reduction system, silane gas is used as a reducing gas and a W or WSi film is formed at a low temperature on the order of 350° C.

The method of $H_2$ reduction system is applied mainly to filling up holes in the surface of a wafer, such as holes between wiring lines, uses hydrogen gas as a reducing gas and deposits a W film at a temperature in the range of about 400° to about 430° C.

All those methods use, for example, $WF_6$ (tungsten hexafluoride). A conventional tungsten film forming method will be explained. A thin Ti/TiN film, for instance, is formed as a barrier metal layer on a surface of a semiconductor wafer before forming a tungsten film. Film forming gases including $WF_6$ gas, $SiH_4$ gas, $H_2$ gas, Ar gas, $N_2$ gas and the like are supplied into a film forming chamber to deposit tungsten seed crystal grains on the surface of the barrier metal layer.

The film forming chamber is evacuated temporarily to a base pressure to remove residual gases from the film forming chamber, and then the Ar gas, $H_2$ gas and $N_2$ gas are supplied into the film forming chamber to set the film forming chamber quickly at a process pressure. Subsequently, $WF_6$ gas is supplied at a predetermined flow rate into the film forming chamber to deposit a tungsten film by hydrogen reduction using $H_2$ gas without using $SiH_4$ gas. Thus, for example, filling up holes and forming a wiring layer are carried out simultaneously.

The development of multilayer semiconductor integrated circuits, and the progressive miniaturization and rise in the level of integration require further reduction of width of lines and diameters of holes. When a wiring pattern is miniaturized, the resistance of wiring lines increases accordingly. Resistivity of wiring lines low enough for conventional design must be reduced further when wiring patterns are miniaturized.

However, it has been difficult to form tungsten films having a satisfactorily low resistivity and meeting new design by the foregoing conventional tungsten film forming method.

A method intended to form a tungsten film having a reduced resistivity to solve the foregoing problems supplies a boron-containing gas such as diborane ($B_2H_6$) gas with Ar gas and $N_2$ gas into the film forming chamber to form a tungsten film of tungsten crystal grains of large grain sizes to reduce resistivity. This method, however, is incapable of forming the tungsten film having satisfactorily low resistivity, and the nitrogen-diluted borane gas produces a solid by polymerization in gas supply pipes and the solid clogs the gas supply pipes.

Generally, unnecessary films are deposited in the processing vessel of a film forming system as a film forming process is repeated certain cycles, and the films fall off in particles. Therefore, a cleaning process is carried out at regular or irregular intervals to remove the unnecessary films by supplying a cleaning gas, such as $ClF_3$ gas, into the processing vessel. The cleaning gas remains, though in only a very small amount, in the processing vessel after cleaning and Cl and F atoms contained in $ClF_3$ gas are introduced into the surface of a semiconductor wafer and act as detrimental impurities.

The present invention has been made in view of such problems and has been created to solve those problems effectively. It is therefore an object of the present invention to provide a tungsten film forming method capable of forming a tungsten film having a low resistivity.

DISCLOSURE OF THE INVENTION

The inventors of the present invention made earnest studies of tungsten film forming methods and acquired a knowledge that crystal grains of large grain sizes can be formed by using a gas containing hydrogen and a borane, such as diborane, for forming a tungsten film, and crystal grains of large grain sizes can be formed by carrying out a tungsten film forming process immediately after processing a semiconductor wafer by a boronizing surface treatment process using a boron-containing gas, such as $B_2H_6$ gas, and have made the present invention.

It is a first feature of the present invention that a method of forming a tungsten film on a surface of an object to be processed by a vacuum processing system, said method comprising the steps of: growing tungsten seed crystal grains on the surface of the object to be processed in an atmosphere of a film forming gas containing tungsten atoms; exposing the object to be processed to an atmosphere of a boron-containing gas for a short time; and forming a tungsten film by making the tungsten seed crystal grains grow in an atmosphere of a gas containing a film forming gas containing tungsten atoms, a hydrogen gas and a hydrogen-diluted boron-containing gas.

When forming the tungsten film after growing seed crystal grains of tungsten on the workpiece and exposing the workpiece to the atmosphere of the boron-containing gas for a short time, the film forming gas is supplied to the workpiece in the presence of boron-containing gas and hydrogen gas. Therefore, tungsten crystal grains forming the tungsten film grow large and thereby the tungsten film having a low resistivity can be formed.

It is a second feature of the present invention that a method of forming a tungsten film on a surface of an object to be processed by a vacuum processing system, said method comprising the steps of: growing tungsten seed crystal grains on the surface of the object to be processed in an atmosphere of a film forming gas containing tungsten atoms; and forming a tungsten film by making the tungsten seed crystal grains grow in an atmosphere of a gas containing a film forming gas containing tungsten atoms, hydrogen gas, and a hydrogen-diluted boron-containing gas.

Although the tungsten film forming method according to the second aspect of the present invention omits the boron-exposure process included in the tungsten film forming method according to the first aspect of the present invention, the same method is able to form a tungsten film having a relatively low resistivity.

It is a third feature of the present invention that, when the boron-containing gas is a 5% hydrogen-diluted $B_2H_6$ gas, the flow rate of the boron-containing gas is about 0.85% or above of the total flow rate of all the gases. When the boron-containing gas is supplied at such a flow rate, the resistivity is included in a preferable range, the boron-containing gas undergoes self decomposition and boron adsorption and bonding occur on a growth surface in the boron-exposure process.

It is a fourth feature of the present invention that a seed crystal grain layer formed in the seed crystal growing process is 50 nm or below in thickness. The seed crystal grain layer of such a thickness is preferable in view of forming a tungsten film having a low resistivity.

It is a fifth feature of the present invention that the total amount of all the gases supplied every minute in the tungsten film forming process is about 100% or above of the volume of the processing vessel of the vacuum processing system. Supply of the gases at such a flow rate is preferable in view of forming a tungsten film having a low resistivity It is a sixth feature of the present invention that, the tungsten film forming process achieves simultaneously, for example, both filling up holes formed in the surface of the object to be processed and forming wiring lines.

It is a seventh feature of the present invention that method of forming a tungsten film on a surface of an object to be processed by a vacuum processing system, said method comprising the steps of: growing tungsten seed crystal grains on the surface of the object to be processed in an atmosphere of a film forming gas containing tungsten atoms; exposing the object to be processed to an atmosphere of a boron-containing gas for a short time; and forming a tungsten film by making the tungsten seed crystal grains grow in an atmosphere of a gas containing a film forming gas containing tungsten atoms.

When the tungsten seed crystal grains are processed by boron surface treatment to expose the workpiece to an atmosphere of a boron-containing gas after the formation of the tungsten seed crystal grains and immediately before the formation of the tungsten film, a tungsten film of large tungsten crystal grains having a low resistivity can be formed.

It is an eighth feature of the present invention that, when the boron-containing gas is a 5% hydrogen-diluted $B_2H_6$ gas, the flow rate of the boron-containing gas is about 0.85% or above of the total flow rate of all the gases. When the boron-containing gas is supplied at such a flow rate, a tungsten film having a considerably low resistivity can be formed.

It is a ninth feature of the present invention that the tungsten film forming process achieves simultaneously, for example, both filling up holes formed in the surface of the object to be processed and forming wiring lines.

BRIEF DESCRIPTION OF THE DRAWINGS

FIG. 4 is a graph showing the dependence of resistivity on the flow rate of 5% $B_2H_6$ gas;

FIG. 5 is a graph showing the dependence of resistivity on 5% $B_2H_6$ gas supply rate;

FIG. 6 is a graph showing the dependence of resistivity on the total flow rate of the gases;

FIG. 7 is a graph showing the dependence of resistivity on the thickness of a tungsten seed crystal grain layer;

FIG. 10 is a graph showing sectional profiles of boron concentration;

BEST MODE FOR CARRYING OUT THE INVENTION

A tungsten film forming method in a preferred embodiment according to the present invention will be described hereinafter with reference to the accompanying drawings.

Figure 1:
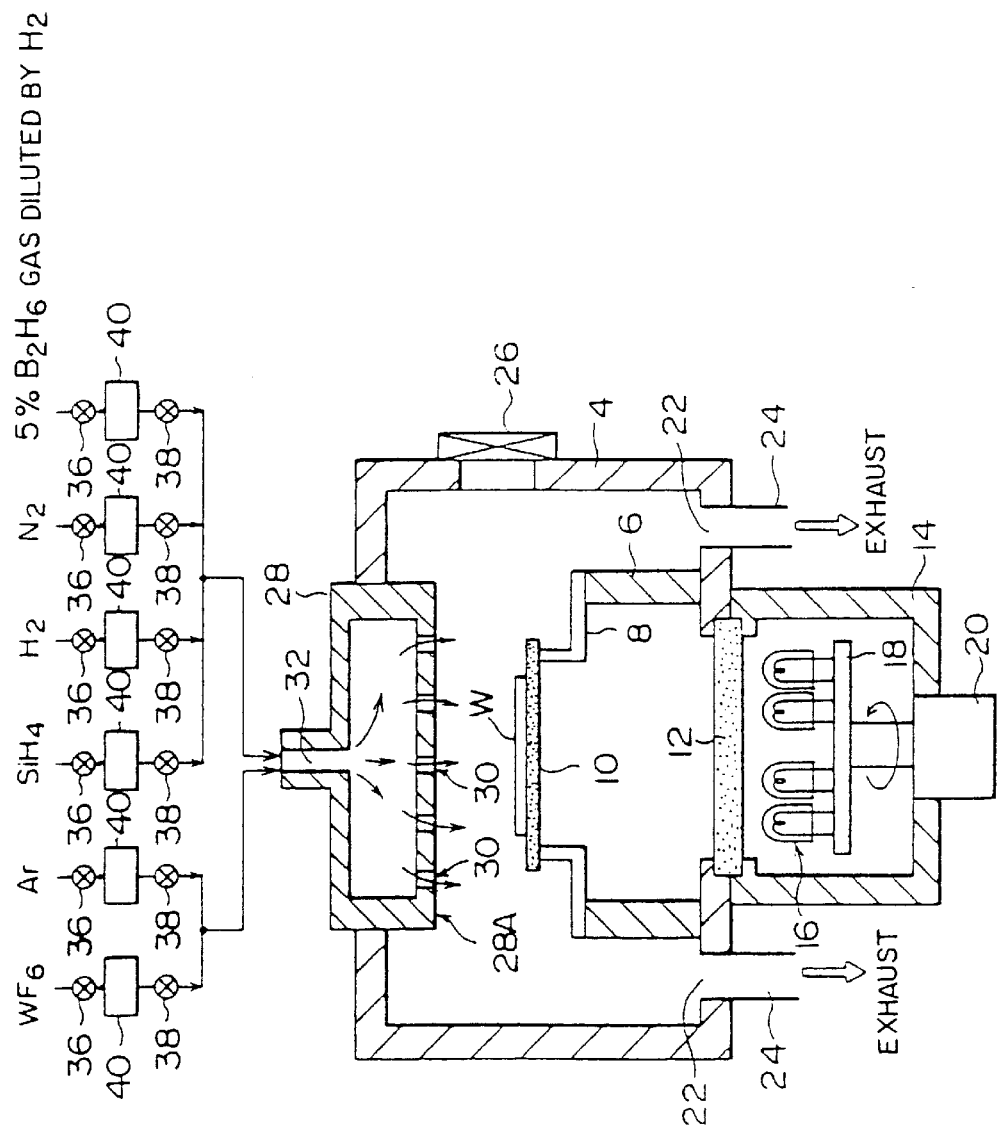
FIG. 1 is a schematic sectional view of a vacuum processing system for carrying out a tungsten film forming method according to the present invention.

FIG. 1 is a schematic view of a vacuum processing system for carrying out the method according to the present invention.

The vacuum processing system for carrying out the method according to the present invention will be described.

The vacuum processing system 2 is provided with a cylindrical processing vessel 4 of aluminum or the like. A cylindrical reflector 6 is set in an upright position on the bottom of the processing vessel 4. A stage 10 for supporting a semiconductor wafer W, i.e., a workpiece, thereon is supported by L-shaped holding members 8 on the reflector 6. The stage 10 is, for example, is formed of carbon or an aluminum compound, such as AlN, and has a thickness on the order of several millimeters.

A transparent window 12 of quartz is set directly below the stage 10 and is attached hermetically to the bottom wall of the processing vessel 4. A box-shaped heating vessel 14 is disposed under the transparent window 12 so as to surround the latter. A plurality of heating lamps 16 attached to a rotary table 18 serving also as a reflector is disposed in the heating vessel 14. The rotary table 18 is driven for rotation by a motor 20. Heat rays radiated by the heating lamps 16 travel through the transparent window 12 and fall on the lower surface of the stage 10 to heat the wafer W supported on the stage 10.

Exhaust ports 22 are formed in peripheral portions of the bottom wall of the processing vessel 4, and exhaust pipes 24 connected to a vacuum pump are connected to the exhaust ports 22 to evacuate the interior of the processing vessel 4. A gate valve 26 is attached to the side wall of the processing vessel 4. The wafer is carried into the processing vessel 4 through the gate valve 26.

A shower head 28 for distributing process gases into the processing vessel 4 is attached to the top wall of the processing vessel 4 opposite to the stage 10. The shower head 28 has a spouting wall 28A provided with a plurality of gas spouting holes 30, and a top wall provided with a gas inlet port 32. A gas supply system for supplying necessary gases for film forming and the like is connected to the gas inlet port 32 of the shower head 28.

Concretely, a boron-containing gas for a tungsten seed crystal forming process can be supplied to the shower head 28. Process gas sources for supplying $WF_6$ gas, Ar gas, $SiH_4$ gas, $H_2$ gas, $N_2$ gas and $B_2H_6$ gas are connected to the shower head 28. Each of pipes connecting the process gas sources to the shower head 28 is provided with a mass-flow controller 34, i.e., flow controller, and two shutoff valves 36 and 38 disposed on the opposite sides of the mass-flow controller 34, respectively. The flow rate of each gas can be controlled and the gas can selectively be supplied or stopped.

Diborane gas ($B_2H_6$ gas) is used as the boron-containing gas. The boron-containing gas is not 100% $B_2H_6$ gas; The boron-containing gas is a 5% hydrogen-diluted $B_2H_6$ gas.

The volume of the processing vessel 4 is about 1200 $cm^3$. The stage 10 has a diameter of about 200 mm and is capable of supporting an 8 in. wafer thereon.

A tungsten film forming method in a first embodiment (example 1) according to the present invention to be carried out by the vacuum processing system thus constructed will be described with reference to FIG. 2.

Figure 2A:
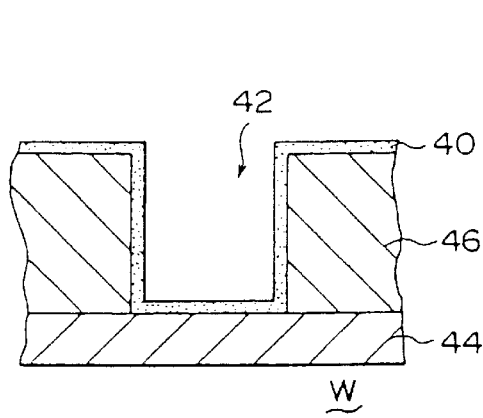
FIGS. 2A, 2B, 2C and 2D are fragmentary, typical sectional views of assistance in explaining a preparatory process, a seed crystal growing process, a boron-exposure process and a tungsten film forming process of a film forming method in a first embodiment according to the present invention, respectively.

The gate valve 26 attached to the side wall of the processing vessel 4 is opened, a wafer W is carried into the processing vessel 4 and is placed on the stage 10 by a carrying arm, not shown. For example, a thin barrier metal layer 40 of Ti/TiN is formed on a surface of the wafer W as shown in FIG. 2A by a preparatory process. The barrier metal layer 40 is formed so as to cover the inner surfaces of holes 42, such as contact holes and via holes. The holes 42 have diameters in the range of, for example, about 0.5 to about 1.0 μm, and aspect ratios in the range of about 1 to about 2, respectively. In FIG. 2, indicated at 44 is a doped polysilicon film and at 46 is an insulating film.

Figure 2B:
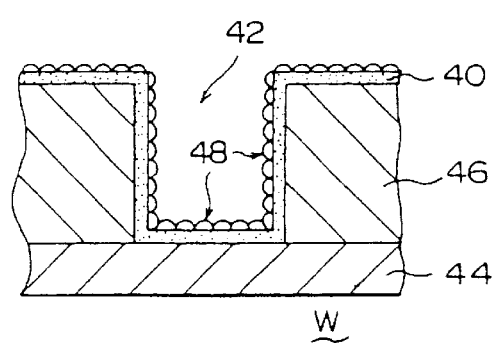

Process gasses $WF_6$ gas, $SiH_4$ gas, $H_2$ gas, Ar gas and $N_2$ gas are supplied at predetermined flow rates, respectively, from the process gas sources to the shower head 28, and a mixture of those process gases are spouted through the gas spouting holes 30 substantially uniformly into the processing vessel 4. $B_2H_6$ gas is not supplied at this stage. At the same time, the interior atmosphere of the processing vessel 4 is evacuated through the exhaust ports 22 to maintain the interior of the processing vessel 4 at a predetermined vacuum on the order of, for example, 4 torr, and the heating lamps 16 are turned and are made to radiate thermal energy. Heat rays radiated from the heating lamps 16 travel through the window 12 and fall on the back surface of the stage 10 to heat the stage 10. Since the thickness of the stage 10 is as very small as several millimeters, the stage 10 is heated rapidly and hence the wafer W mounted on the stage 10 can be rapidly heated up to a predetermined temperature. Process temperature is, for example, about 460° C. The mixed gas supplied into the processing vessel 4 undergoes a predetermined chemical reaction and, as shown in FIG. 2B, $WF_6$ is reduced and tungsten seed crystal grains 48 are formed on the surface of the barrier metal layer 40 for a seed crystal growing process. The seed crystal growing process is continued, for example, for about 30s to form an about 30 nm thick seed crystal grain layer.

After the completion of the seed crystal growing process, a boron-exposure process is started.

Figure 2C:
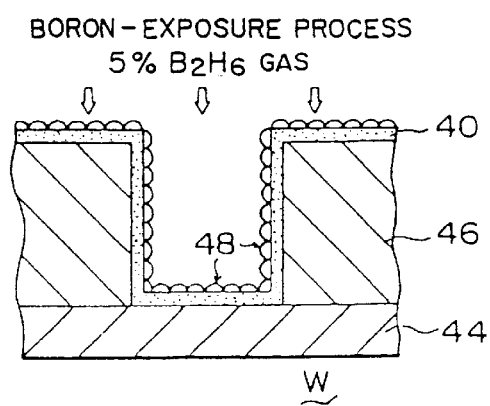

First, the supply of all the process gases is stopped, the processing vessel 4 is evacuated to a base pressure of, for example, on the order of $10^{-3}$ torr, and predetermined gases including $B_2H_6$ gas is supplied to maintain the pressure in the processing vessel 4 at about 80 torr for a short time for the boron-exposure process as shown in FIG. 2C. Ar gas, $H_2$ gas and a 5% $B_2H_6$ gas (hydrogen-diluted) are supplied at 4000, 1800 and 100 sccm, respectively. $WF_6$ gas, $SiH_4$ gas and $N_2$ gas are not supplied. The tungsten seed crystal grains 48 are exposed to boron, $B_2H_6$ gas decomposes, and boratite is formed on the tungsten seed crystal grain layer. Consequently, the seed crystal grains grow to some extent. The boron-exposure process is continued, for example, for about 28 s at about 460° C.

After the completion of the boron-exposure process, a tungsten film forming process is started.

Figure 2D:
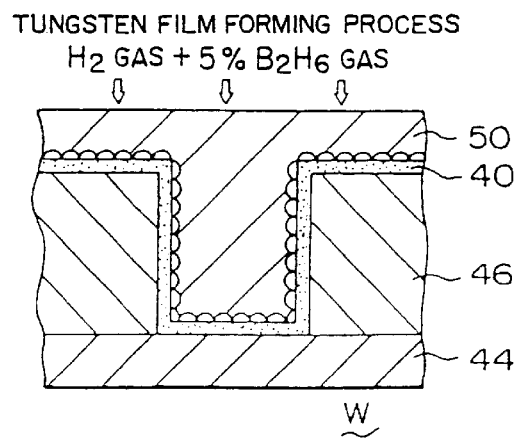

First, $WF_6$ gas, Ar gas, $H_2$ gas and 5% $B_2H_6$ gas (hydrogen-diluted) are supplied at 25, 4400, 600 and 25 sccm, respectively, to form a tungsten film. The supply of $SiH_4$ gas and $N_2$ gas is stopped. The same process pressure of 80 torr and the same process temperature of 460° C. as those of the preceding process are used. Consequently, holes 42 (FIG. 2A) are filled up and, at the same time, a wiring tungsten film 50 is formed as shown in FIG. 2D. The duration of the tungsten film forming is, for example, about 40 s. The overall thickness of the tungsten film 50 is 100 nm The boron-exposure process is carried out subsequently to the seed crystal growing process to expose the tungsten seed crystal grains to diborane for hydrogen reduction to form boratite partially, and $B_2H_6$ gas is supplied also in the tungsten film forming process for hydrogen reduction to form boratite while the tungsten film is formed. Therefore, the tungsten seed crystal grains grow considerably. Therefore, the tungsten film 50 has crystal structure similar to bulk crystal structure and has a considerably low resistivity.

Whereas the resistivity of a tungsten film formed by the conventional tungsten film forming method not using $B_2H_6$ gas was about 12.2 μΩcm (1500 Å), the resistivity of a tungsten film formed by the tungsten film forming method according to the present invention was about 8.0 μΩcm (1500 Å), which proved significant resistivity improvement.

Figure 3:
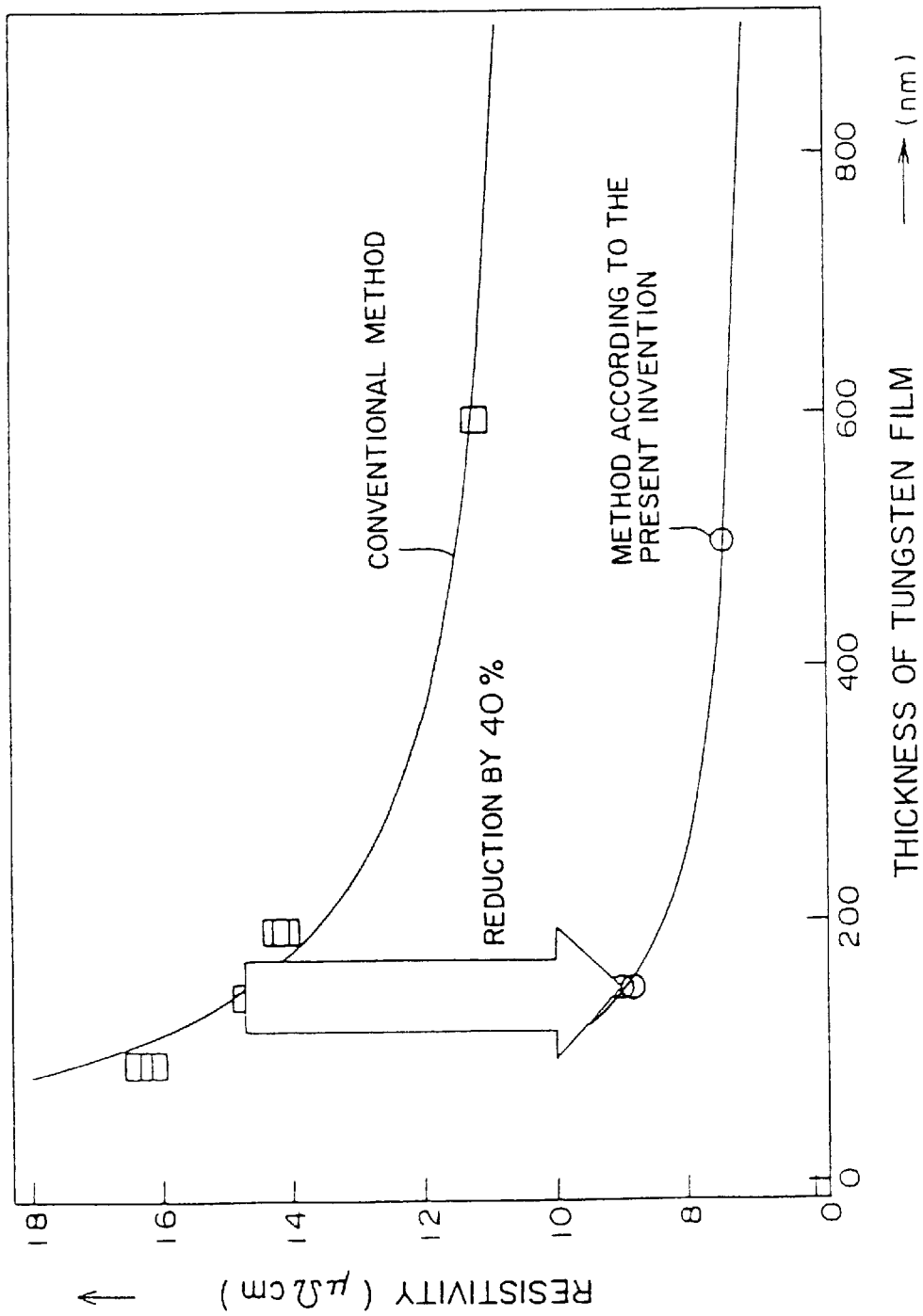
FIG. 3 is a graph comparatively showing the resistivity of a film formed by the tungsten film forming method of the present invention and that of a film formed by a conventional tungsten film forming method not using $B_2H_6$.

As obvious from FIG. 3 comparatively showing the resistivity of a tungsten film formed by the conventional tungsten film forming method and that of a tungsten film formed by the tungsten film forming method according to the present invention, the resistivity of the tungsten film formed by the method according to the present invention is lower by about 40% than that of the tungsten film formed by the conventional method regardless of thickness.

The boron content (B content), the chlorine content (Cl content) and fluorine content (F content) of the wafer including the tungsten film formed by the method according to the present invention and the wafer including the tungsten film formed by the conventional method were measured. The B content of the wafer processed by the method according to the present invention, as a matter of course, was large, and the Cl and the F content of the same were considerably small, which proved that the detrimental effect of a residual cleaning gas can be suppressed. The result of the measurement of this point will be described later.

The method according to the present invention had no problem at all in filling up the holes 42 and the method according to the present invention, similarly to the conventional method, could satisfactorily fill up the holes 42.

The tungsten film forming method in the first embodiment (example 1) according to the present invention uses the hydrogen-diluted 5% $B_2H_6$ gas at 100 sccm. It is preferable that the flow rate of the hydrogen-diluted 5% $B_2H_6$ gas is about 50 sccm or above, i.e., about 0.85% of the total flow rate of all the gasses ($\approx 50\times 100/(4000+180+50)$) or above. If the flow rate of the hydrogen-diluted 5% $B_2H_6$ gas is less than about 50 sccm, the resistivity is not significantly low, which will be described with reference to FIG. 4. In order to show the results described above, FIG. 4 shows the dependence of resistivity (1800 Å) on the flow rate of the hydrogen-diluted 5% $B_2H_6$ gas. As mentioned above, the respective flow rates of Ar gas and $H_2$ gas are fixed at 4000 sccm and 1800 sccm.

As obvious from the graph shown in FIG. 4, the resistivity of the tungsten film is undesirably high and higher than 11.3 $\mu\Omega$cm when the flow rate of the hydrogen-diluted 5% $B_2H_6$ gas is below 50 sccm. When the flow rate of the hydrogen-diluted 5% $B_2H_6$ gas is not lower than 50 sccm, the resistivity is less than 11 $\mu\Omega$cm. Thus, the measurements shows that it is desirable to supply the 5% $B_2H_6$ gas in the boron-exposure process at a flow rate of 50 sccm or above (0.85% or above of the total flow rate of all the gases).

In the tungsten film forming process, differently from in the boron-exposure process, if the hydrogen-diluted 5% $B_2H_6$ gas is supplied at an excessively high rate, the resistivity increases unpreferably. For example, it is preferable that the flow rate of the hydrogen-diluted 5% $B_2H_6$ gas is about 2% or below of the total flow rate of all the gases. The lower limit of percentage of the flow rate of the hydrogen-diluted 5% $B_2H_6$ gas to the total flow rate of all the gases is about 0.2%. If the hydrogen-diluted 5% $B_2H_6$ gas is supplied at a flow rate lower than the lower limit, the resistivity lowering effect is insignificant.

FIG. 5 shows the dependence of resistivity on 5% $B_2H_6$ gas supply rate. The respective supply rates of $WF_6$ gas, Ar gas and $H_2$ gas are fixed at values specified in Table 1 showing conditions for tungsten film forming processes. As obvious from the graph shown in FIG. 5, resistivity increases sharply as the supply rate of the 5% $B_2H_6$ gas increases beyond 100 sccm (about 2% of the supply rate of all the gases), and increases also as the supply rate of the 5% $B_2H_6$ gas decreases below 10 sccm (about 0.2% of the supply rate of all the gases). Accordingly, it is desirable that the supply rate of the 5% $B_2H_6$ gas is in the range of 10 to 100 sccm.

The resistivity of the tungsten film can be reduced to some extent by supplying the gases at a flow rate higher than a certain level relative to the volume of the processing vessel 4. This point will be described referring to FIG. 6. FIG. 6 shows the dependence of resistivity on the total flow rate of all the gases in the tungsten film forming process. In FIG. 6, the total flow rate of all the gases and the ratio of the total flow rate of all the gases to the volume of the processing vessel 4 are measured on the horizontal axis. The flow rate ratio between the gases is fixed at the value for the tungsten film forming process shown in Table 1 and the total flow rate of all the gases is varied.

As obvious from the graph shown in FIG. 6, resistivity decreases gradually with the increase of the total flow rate of all the gases and remains substantially constant when the total flow rate of all the gasses increases beyond 1220 sccm. It is known from FIG. 6 that the total flow rate of all the gases in the tungsten film forming process must be not lower than 1220 sccm, i.e., 100% or above of the volume of the processing vessel. Incidentally, the first embodiment (example 1) supplies the gases at 5050 sccm in the tungsten film forming process.

The resistivity of the tungsten film is greatly dependent on the thickness of the tungsten seed crystal grain layer. The thickness of the tungsten seed crystal grain layer must be about 50 nm or below to obtain a tungsten film having a resistivity of 12 $\mu\Omega$cm or below. FIG. 7 shows the dependence of resistivity on the thickness of the tungsten seed crystal grain layer. It is obvious from FIG. 7 that resistivity increases gradually with the increase of the thickness of the tungsten seed crystal grain layer, and the resistivity is greater than about 12 $\mu\Omega$cm when the thickness is greater than 50 nm. Therefore, it is desirable that the thickness of the tungsten seed crystal grain layer is 50 nm or below. However, it is difficult to form the tungsten film if the thickness of the tungsten seed crystal grain layer is excessively thin and hence the lower limit of the thickness is about 10 nm.

Figure 8:
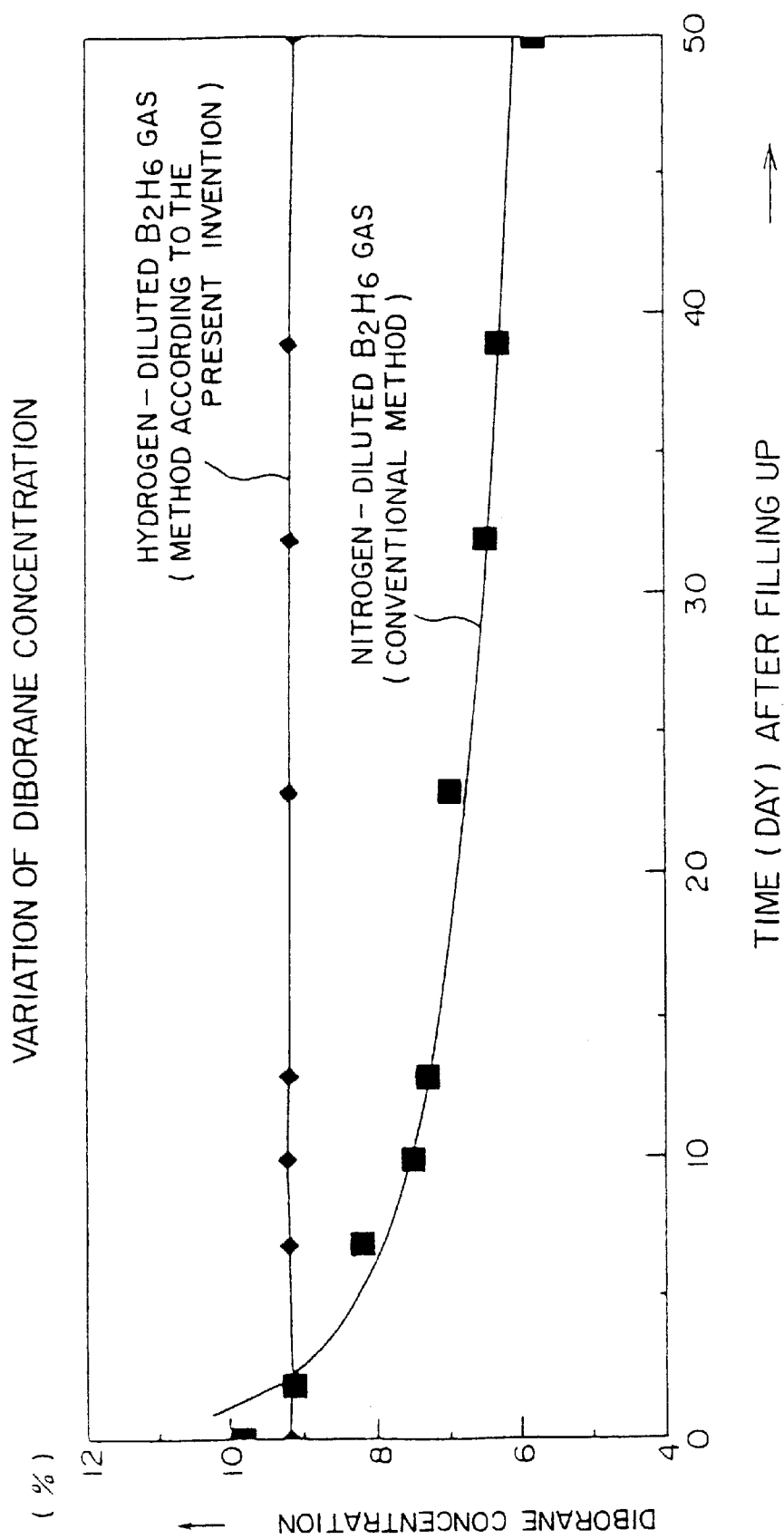
FIG. 8 is a graph showing the variation of diborane ($B_2H_6$) concentration with time for a case when a nitrogen-diluted $B_2H_6$ gas is used (conventional method) and a case when a hydrogen-diluted $B_2H_6$ gas is used (present invention)

Since the method according to the present invention uses the 5% $B_2H_6$ gas prepared by diluting $B_2H_6$ gas with $H_2$ gas as the boron-containing gas instead of a born-containing gas prepared by diluting $B_2H_6$ gas with $N_2$ gas or Ar gas and used by the conventional method, the polymerization of $B_2H_6$ gas does not occur in the gas container and $B_2H_6$ gas supply piping and hence the clogging of piping with a solid formed by polymerization can be prevented. FIG. 8 is a graph showing the variation of $B_2H_6$ concentration with time for a case where a nitrogen-diluted $B_2H_6$ gas is used (conventional method) and a case where a hydrogen-diluted $B_2H_6$ gas is used (present invention). As obvious from the graph shown in FIG. 8, the $B_2H_6$ concentration of the nitrogen-diluted $B_2H_6$ gas decreases with time, which proves that $B_2H_6$ polymerizes. The $B_2H_6$ concentration of the hydrogen-diluted $B_2H_6$ gas employed in the method according to the present invention remains constant regardless of time, which proves that $B_2H_6$ does not polymerize. It is considered that molecules of $B_2H_6$ become unstable when $B_2H_6$ gas is diluted with $N_2$ gas.

Figure 9A:
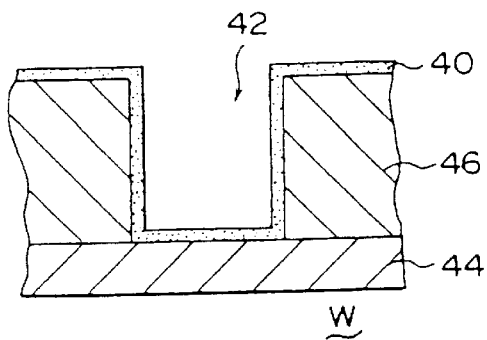
FIGS. 9A, 9B, 9C and 9D are fragmentary, typical sectional views of assistance in explaining a preparatory process, a seed crystal growing process, a pressure raising process, and a tungsten film forming process of a film forming method in a second embodiment according to the present invention, respectively.
Figure 9B:
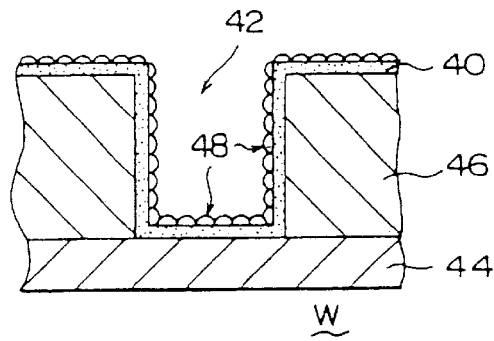
Figure 9C:
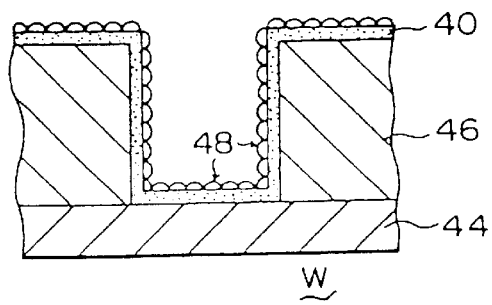
Figure 9D:
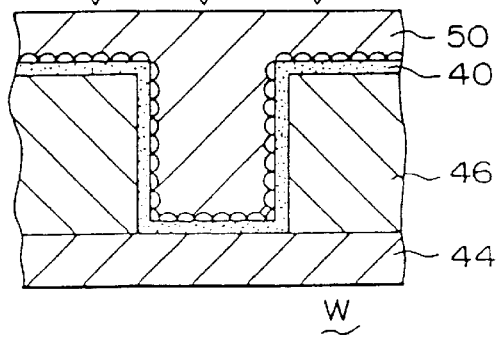

The tungsten film forming method in the first embodiment (example 1) carries out the boron-exposure process as shown in FIG. 2C between the tungsten seed crystal growing process and the tungsten film forming process. A tungsten film forming method in a second embodiment according to the present invention omits the boron-exposure process and has a simple pressure raising process instead of the boron-exposure process. The pressure raising process is carried out to purge residual gases remaining in the processing vessel and to adjust pressure. FIGS. 9A, 9B, 9C and 9D are views of assistance in explaining a preparatory process, a seed crystal growing process, a pressure raising process, and a tungsten film forming process, respectively, of the film forming method in the second embodiment, in which the processes excluding the process shown in FIG. 9C are the same as those shown in FIG. 2. In the pressure raising process shown in FIG. 9C, the processing vessel 4 is evacuated to a base pressure, and then Ar gas, $H_2$ gas and $N_2$ gas are supplied at 2700, 1800 and 900 sccm into the processing vessel 4 to increase the pressure in the processing vessel 4 to the process pressure of 80 torr.

Process conditions for the tungsten film forming method in the second embodiment excluding those for the pressure raising process are the same as those for the tungsten film forming method in the first embodiment (example 1). Although not as effective as the first embodiment (example 1), the second embodiment is capable of forming a tungsten film having a considerably low resistivity even though the boron-exposure process in the first embodiment is omitted.

Figure 11:
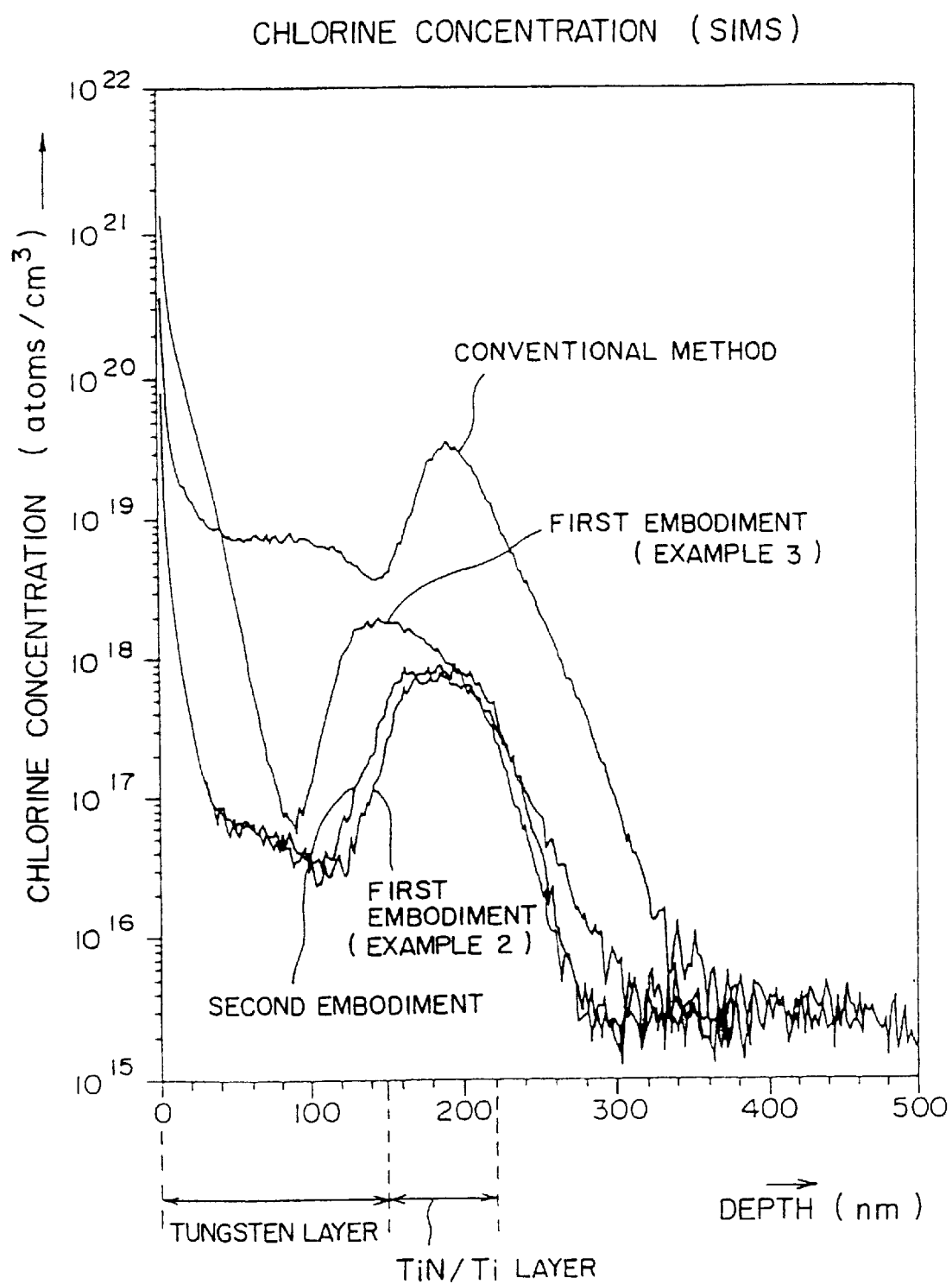
FIG. 11 is a graph showing sectional profiles of chlorine concentration.
Figure 12:
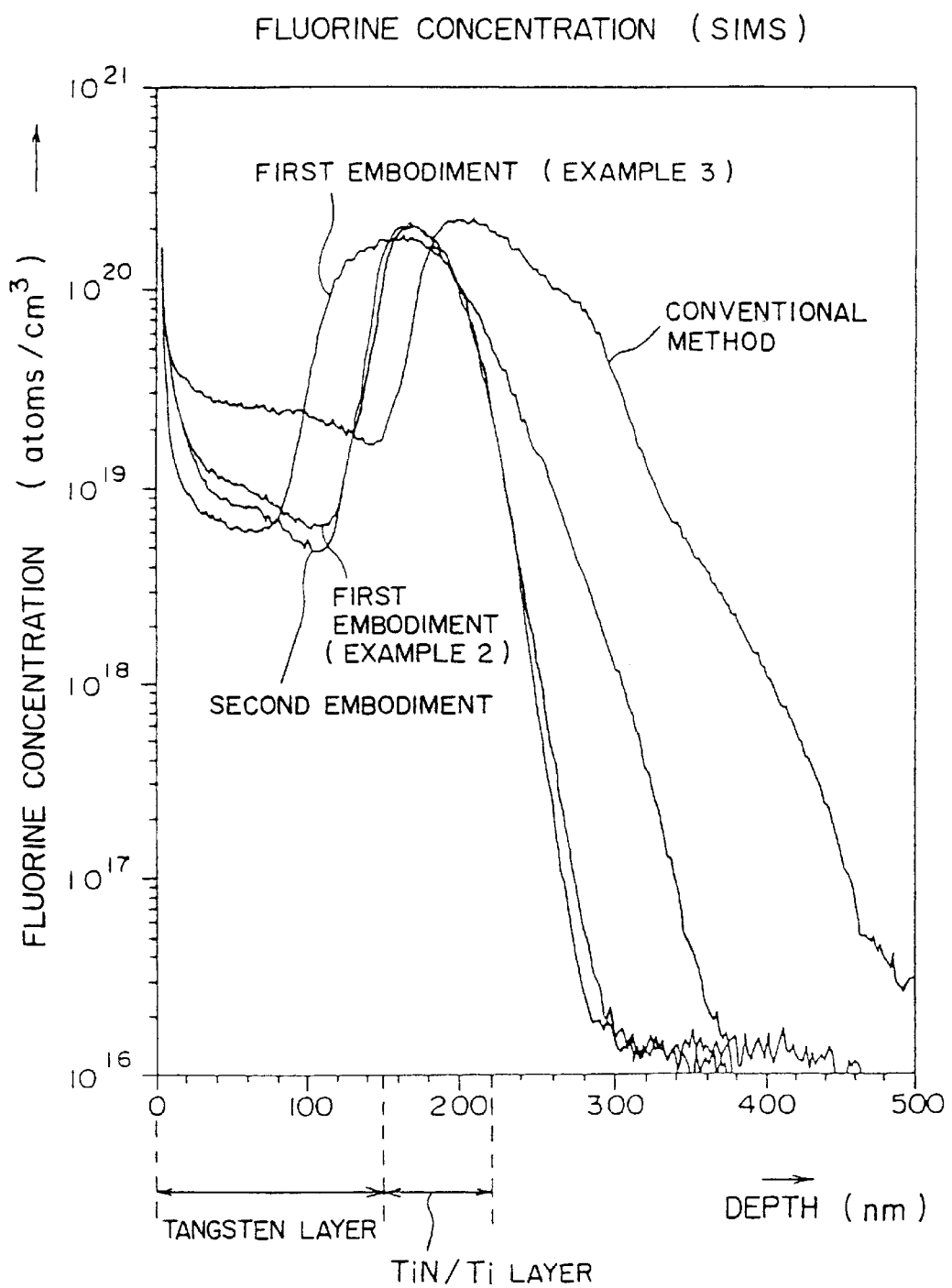
FIG. 12 is a graph showing sectional profiles of fluorine concentration.

Comparative test of the conventional method and the methods in the first embodiment (example 2, example 3) and the second embodiment of the present invention was conducted. Table 1 shows the respective flow rates of gases for the tungsten film forming process, existence of the process of exposure to B2H6 gas and the resistivities of tungsten films formed by those methods. FIG. 10 is a graph showing sectional profiles of boron concentration, FIG. 11 is a graph showing sectional profiles of chlorine concentration, and FIG. 12 is a graph showing sectional profiles of fluorine concentration.

TABLE 1

| | $WF_6$ | 5% $B_2H_6$ | $H_2$ | Ar | Boron-exposure process | Resistivity |
|---|---|---|---|---|---|---|
| First embodiment (Example 2) | 20 | 20 | 750 | 3500 | Included | 8.82 |
| First embodiment (Example 3) | 20 | 20 | 750 | 1000 | Included | 10.6 |
| Second embodiment | 20 | 20 | 750 | 1000 | Omitted | 11.6 |
| Conventional method | 20 | — | 750 | 1000 | Omitted | 14.5 |

As obvious from Table 1, the resistivity of the tungsten film formed by the conventional method is 14.5 $\mu\Omega$cm, and the resistivity of the tungsten film formed by the method in the second embodiment omitting the boron-exposure process is 11.6 $\mu\Omega$cm, which is lower than that of the tungsten film formed by the conventional method. The resistivities of the tungsten films formed by the method in the first embodiment are 10.6 $\mu\Omega$cm or below which are far lower than that of the tungsten film formed by the conventional method. The resistivity of the tungsten film formed by the method in Example 2 of the first embodiment supplying Ar gas at an increased flow rate is as low as 8.82 $\mu\Omega$cm. Resistivity reducing effect is significant when the total flow rate of all the gases is high.

As obvious from FIG. 10, boron concentrations in the tungsten films formed by the methods in Examples 2 and 3 of the first embodiment are high and those in the tungsten films formed by the method in the second embodiment and the conventional methods are low. As obvious from FIG. 11, chlorine concentration of the tungsten film formed by the conventional method is considerably high and undesirable, and those of the tungsten films formed by the methods in the first and the second embodiment are considerably low and satisfactory.

As shown in FIG. 12, whereas the fluorine concentration of the tungsten film formed by the conventional method is high, those of the tungsten films formed by the methods in the first and the second embodiment are low and satisfactory.

It is inferred that both the chlorine concentration and the fluorine concentration of the tungsten films formed by the methods according to the present invention are low because the mobility of electrons in the boron-doped film is enhanced and resistance decreased due to the reduction of F and Cl, i.e., impurities, large crystal grains are formed and contact resistance at grain boundaries is reduced.

A tungsten film forming method in a third embodiment according to the present invention will be described hereinafter The tungsten film forming method in the third embodiment uses the vacuum processing system 2 shown in FIG. 1 used by the first and the second embodiment.

The tungsten film forming method in the third embodiment is similar to that in the first embodiment, matters connecting with the third embodiment and distinct from those connecting with the first embodiment will mainly be described. A preparatory process and a seed crystal growing process shown in FIGS. 2A and 2B similar to those included in the first embodiment are carried out.

Subsequently, a boron-exposure process is carried out as shown in FIG. 2C. In the boron-exposure process, Ar gas, $H_2$ gas and 5% $B_2H_6$ gas are supplied at 4000, 1800 and 100 sccm. Tungsten seed crystal grains 48 are exposed to boron. A boron-doped layer is formed by the $B_2H_6$ gas. The boron-exposure process is continued, for example, for 28 s at a process temperature of about 460° C.

After the completion of the boron-exposure process, a tungsten film forming process is started.

First, $WF_6$ gas, Ar gas, $H_2$ gas and $N_2$ gas are supplied at 80, 900, 750 and 100 sccm, respectively, to form a tungsten film. The supply of $SiH_4$ gas and $B_2H_6$ gas is stopped. The same process pressure of 80 torr and the same process temperature of 460° C. as those of the preceding process are used. Consequently, holes 42 (FIG. 2A) are filled up and, at the same time, a wiring tungsten film 50 is formed as shown in FIG. 2D. The duration of the tungsten film forming process is, for example, about 98 s. The overall thickness of the tungsten film 50 is 800 nm.

The boron-exposure process is carried out between the seed crystal growing process and a tungsten film forming process to form a boron layer by exposing the tungsten seed crystal grains to, for example, diborane. Thus, the tungsten seed crystal grains grow large in the succeeding process. Therefore, the tungsten film 50 has crystal structure similar to bulk crystal structure and has a considerably low resistivity.

Whereas the resistivity of a tungsten film formed by the conventional tungsten film forming method not using $B_2H_6$ gas was about 12.2 $\mu\Omega$cm (1500 Å), the resistivity of a tungsten film formed by the tungsten film forming method according to the present invention was about 8.5 $\mu\Omega$cm (1500 Å), which proved significant resistivity improvement.

Figure 13A:
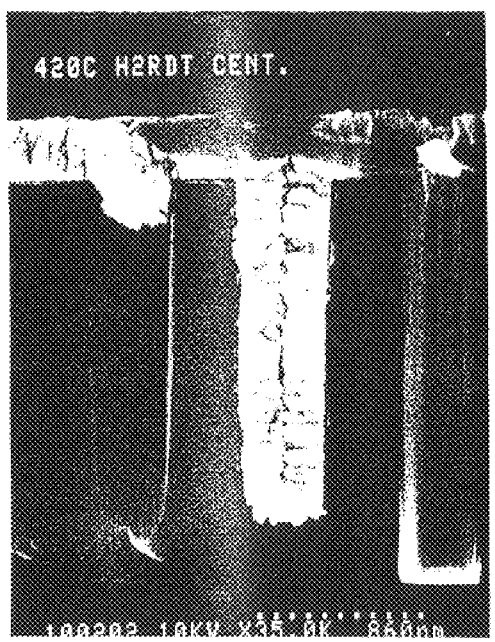
FIGS. 13A and 13B are photographs taken by an electron microscope of sections of holes filled up with a tungsten film by a conventional method and a method according to the present invention, respectively.
Figure 13B:
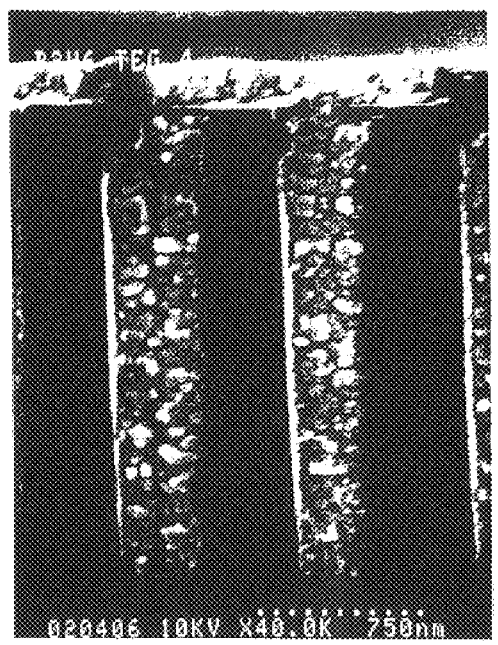

FIGS. 13A and 13B are photographs taken by an electron microscope of sections of holes filled up with a tungsten film by a conventional method and a method according to the present invention, respectively. As obvious from FIGS. 13A and 13B, tungsten crystal grains formed by the method according to the present invention are greater than those formed by the conventional method and are similar to bulk crystal structure.

The method according to the present invention, similarly to the conventional method, had no problem and was satisfactory in ability to fill up the holes 42.

The boron-exposure process of the method according to the present invention supplies the hydrogen-diluted 5%

$B_2H_6$ gas at 100 sccm in the boron-exposure process. Preferably, the flow rate of the hydrogen-diluted 5% $B_2H_6$ gas is about 50 sccm or above, i.e., about 0.85% of the total flow rate of all the gases (50×100/(4000+180+50)) or above. The resistivity of the tungsten film is not very low when the flow rate of the 5% $B_2H_6$ gas is below about 50 sccm. This fact is the same as that of the first embodiment illustrated in FIG. 4.

The method according to the present invention uses the hydrogen-diluted 5% $B_2H_6$ gas. $B_2H_6$ contained in the hydrogen-diluted 5% $B_2H_6$ gas, differing from that contained in a nitrogen-diluted or argon-diluted $B_2H_6$ gas, does not polymerize in the $B_2H_6$ gas container and $B_2H_6$ gas supply piping and hence the clogging of the piping with a solid formed by polymerization can be prevented. FIG. 8 is a graph showing the variation of $B_2H_6$ concentration with time for a nitrogen-diluted $B_2H_6$ gas (conventional method) and a hydrogen-diluted $B_2H_6$ gas (present invention). As obvious from the graph shown in FIG. 8, the $B_2H_6$ concentration of the nitrogen-diluted $B_2H_6$ gas decreases with time, which proves that $B_2H_6$ polymerizes. The $B_2H_6$ concentration of the hydrogen-diluted $B_2H_6$ gas employed in the method according to the present invention remains constant regardless of time, which proves that $B_2H_6$ does not polymerize. It is considered that molecules of $B_2H_6$ become unstable when $B_2H_6$ gas is diluted with $N_2$ gas.

The flow rates of the gases, process temperatures and the process pressures mentioned in connection with the description of the preferred embodiments and shown in the table are only examples and not limitative. Although this embodiment uses the hydrogen-diluted $B_2H_6$ gas having a $B_2H_6$ concentration of 5%, naturally, the limit values of flow rate change according to the $B_2H_6$ concentration of the diluted $B_2H_6$ gas. The boron-containing gas is not limited to diborane gas; the boron-containing gas may be any borane gas, such as tetraborane gas or pentaborane gas. The present invention is applicable to processing wafers of sizes other than that mentioned above. The workpiece is not limited to the semiconductor wafer, but may be a glass substrate or an LCD substrate.

As is apparent from the foregoing description, the tungsten film forming method according to the present invention exercises the following excellent operations and effects.

According to the first feature of the present invention, the tungsten film is formed by exposing the tungsten seed crystal grains posed to the boron-containing gas, and then reduction is carried out by using the boron-containing gas in the tungsten film forming process Therefore, tungsten crystal grains forming the tungsten film grow large and the tungsten film has a low resistivity.

According to the second feature of the present invention, the tungsten film is formed by growing tungsten seed crystal grains and carrying out reduction by using the boron-containing gas when forming the tungsten film. Therefore, tungsten crystal grains forming the tungsten film are large and the tungsten film has a considerably low resistivity.

When the hydrogen-diluted 5% $B_2H_6$ gas is used as a boron-containing gas, the hydrogen-diluted 5% $B_2H_6$ gas is supplied at a flow rate equal to about 0.85% or above of the total flow rate of all the gases. Thus, a tungsten film having a still lower resistivity can be formed. A tungsten film having a still lower resistivity can be formed when the tungsten seed crystal grain layer is formed in a thickness of 50 nm or below. A tungsten film having a still lower resistivity can be formed when the gases are supplied in the tungsten film forming process so that the amount of the gases supplied in one minute is about 100% or below of the volume of the processing vessel.

The boron-exposure process is carried out between the seed crystal growing process and the tungsten film forming process to expose the workpiece to the boron-containing gas. Thus, the tungsten seed crystal grains grow large in the succeeding process. Therefore, the tungsten film having large tungsten crystal grains and a low resistivity can be formed.

What is claimed is:

1. A method of forming a tungsten film on a surface of an object to be processed by a vacuum processing system, said method comprising the steps of:

growing tungsten seed crystal grains on the surface of the object to be processed in an atmosphere of a first film forming gas containing tungsten atoms;

exposing the object to be processed to an atmosphere of a boron-containing gas; and forming and growing a tungsten film on the tungsten seed crystal grains in an atmosphere of a second film forming gas containing tungsten atoms and a hydrogen-diluted boron-containing gas.

2. A method of forming a tungsten film on a surface of an object to be processed by a vacuum processing system, said method comprising the steps of:

growing tungsten seed crystal grains on the surface of the object to be processed in an atmosphere of a first film forming gas containing tungsten atoms; and forming and growing a tungsten film on the tungsten seed crystal grains in an atmosphere of a second film forming gas containing tungsten atoms and a hydrogen-diluted boron-containing gas.

3. The method of forming a tungsten film on a surface of an object to be processed by a vacuum processing system according to claim 1 or 2, wherein a flow rate of the boron-containing gas is about 0.2% or more of a total flow rate of all gases.

4. The method of forming a tungsten film on a surface of an object to be processed by a vacuum processing system according to claim 1 or 2, wherein the tungsten seed crystal grains are formed in a layer of a thickness of about 50 nm or less.

5. The method of forming a tungsten film on a surface of an object to be processed by a vacuum processing system according to claim 1 or 2, wherein the gases are supplied in the tungsten film forming process at a flow rate such that a volume of the gases supplied in one minute is about 100% or more of a volume of a processing vessel in the vacuum processing system.

6. The method of forming a tungsten film on a surface of an object to be processed by a vacuum processing system according to claim 1 or 2, wherein each step achieves both filling up holes in the surface of the object to be processed and forming wiring lines simultaneously.

7. The method of forming a tungsten film on a surface of an object to be processed by a vacuum processing system according to claim 1 or 2, wherein the first film forming gas contains WF6, Ar, SiH4, H2 and N2.

8. The method of forming a tungsten film on a surface of an object to be processed by a vacuum processing system according to claim 1 or 2, wherein the second film forming gas contains WF6, Ar, H2 and N2.

9. The method of forming a tungsten film on a surface of an object to be processed by a vacuum processing system according to claim 1 or 2, wherein the boron-containing gas contains one of diborane, tetraborane and pentaborane.

10. The method of forming a tungsten film on a surface of an object to be processed by a vacuum processing system according to claim 1 or 2, wherein when a pressure of the first film forming gas in the step of growing tungsten seed crystal grains is a first pressure, a pressure of the boron-containing gas in the step of exposing the object to the boron-containing gas is a second pressure, and a pressure of the second film forming gas in the step of forming tungsten film is the second pressure, the second pressure is equal to or higher than the first pressure.

11. A method of forming a tungsten film on a surface of an object to be processed by a vacuum processing system, said method comprising the steps of:

growing tungsten seed crystal grains on the surface of the object to be processed in an atmosphere of a first film forming gas containing tungsten atoms;

exposing the object to be processed to an atmosphere of a hydrogen-diluted boron-containing gas; and forming and growing a tungsten film on the tungsten seed crystal grains in an atmosphere of a second film forming gas containing tungsten atoms.

12. The method of forming a tungsten film on a surface of an object to be processed by a vacuum processing system according to claim 11, wherein a flow rate of the hydrogen-diluted boron-containing gas in the step of exposing the object to the boron-containing gas is about 0.2% or more of a total flow rate of all gases.

13. The method of forming a tungsten film on a surface of an object to be processed by a vacuum processing system according to claim 11, wherein each step achieves both filling up holes in the surface of the object to be processed and forming wiring lines simultaneously.

14. A method of producing a semiconductor device comprising the steps of:

forming a insulating layer on a conductive layer formed on a substrate;

forming a hole reaching the conductive layer in the insulating layer formed on the conductive layer;

forming a barrier metal layer on a bottom and side surface of the hole and on the insulating layer;

growing tungsten seed crystal grains on a surface of the barrier metal layer in an atmosphere of a first film forming gas containing tungsten atoms;

exposing the tungsten seed crystal grains to an atmosphere of a hydrogen-diluted boron-containing gas;

forming and growing a tungsten film on the tungsten seed crystal grains in an atmosphere of a second film forming gas containing tungsten atoms and a hydrogen-diluted boron-containing gas.

15. The method of producing a semiconductor device according to claim 14 wherein the barrier metal layer is formed as a continuous film of Ti/TiN.

16. The method of producing a semiconductor device according to claim 14 wherein the boron-containing gas contains one of diborane, tetraborane and pentaborane.

17. A method of forming a tungsten film on a surface of an object to be processed by a vacuum processing system, said method comprising the steps of:

growing tungsten seed crystal grains on the surface of the object to be processed in an atmosphere of a first film forming gas containing tungsten atoms and a hydrogen-diluted boron-containing gas; and forming and growing a tungsten film on the tungsten seed crystal grains in an atmosphere of a second film forming gas containing tungsten atoms.

18. A method of forming a tungsten film on a surface of an object to be processed by a vacuum processing system, said method comprising the steps of:

growing tungsten seed crystal grains on the surface of the object to be processed in an atmosphere of a first film forming gas containing tungsten atoms and a hydrogen-diluted boron-containing gas;

exposing the object to be processed to an atmosphere of a boron-containing gas; and forming and growing a tungsten film on the tungsten seed crystal grains in an atmosphere of a second film forming gas containing tungsten atoms.

19. A method of forming a tungsten film on a surface of an object to be processed by a vacuum processing system, said method comprising the steps of:

growing tungsten seed crystal grains on the surface of the object to be processed in an atmosphere of a first film forming gas containing tungsten atoms and a hydrogen-diluted boron-containing gas;

exposing the object to be processed to an atmosphere of a boron-containing gas; and forming and growing a tungsten film on the tungsten seed crystal grains in an atmosphere of a second film forming gas containing tungsten atoms and a hydrogen-diluted boron-containing gas.

20. The method of forming a tungsten film on a surface of an object to be processed by a vacuum processing system according to claim 18 or 19, wherein the boron-containing gas in the step of exposing the object to the boron-containing gas is diluted with hydrogen gas.

21. The method of forming a tungsten film on a surface of an object to be processed by a vacuum processing system according to any one of claims 17 to 19, wherein a flow rate of the hydrogen-diluted boron-containing gas is about 0.2% or more of a total flow rate of all gases.

22. The method of forming a tungsten film on a surface of an object to be processed by a vacuum processing system according to any one of claims 17 to 19, wherein a dilution ratio of the boron-containing gas with hydrogen is about 10% or less.

* * * * *